US006374337B1

(12) United States Patent
Estakhri

(10) Patent No.: US 6,374,337 B1
(45) Date of Patent: Apr. 16, 2002

(54) DATA PIPELINING METHOD AND APPARATUS FOR MEMORY CONTROL CIRCUIT

(75) Inventor: Petro Estakhri, Pleasanton, CA (US)

(73) Assignee: Lexar Media, Inc., Fremont, CA (US)

( * ) Notice: Subject to any disclaimer, the term of this patent is extended or adjusted under 35 U.S.C. 154(b) by 0 days.

(21) Appl. No.: 09/440,986

(22) Filed: Nov. 16, 1999

Related U.S. Application Data
(60) Provisional application No. 60/108,872, filed on Nov. 17, 1998.

(51) Int. Cl.$^7$ ........................... G06F 12/00; G06F 13/14
(52) U.S. Cl. ..................... 711/169; 711/100; 711/103; 711/154; 365/189.01; 365/189.05
(58) Field of Search ................... 711/100, 102, 711/103, 104, 140, 154, 169; 365/189.01, 189.05

(56) References Cited
U.S. PATENT DOCUMENTS

| 3,633,175 A | 1/1972 | Harper ................... 340/172.5 |
| 4,006,457 A | 2/1977 | Hepworth et al. ....... 340/147 R |
| 4,013,902 A | 3/1977 | Payne ......................... 307/268 |
| 4,210,959 A | 7/1980 | Wozniak ..................... 364/200 |
| 4,250,570 A | 2/1981 | Tsang et al. ................ 365/200 |

(List continued on next page.)

FOREIGN PATENT DOCUMENTS

| AU | 0 557 723 | 1/1987 | ............ G11C/5/00 |
| EP | 0 220 718 A2 | 5/1987 | ........... G06F/15/40 |
| EP | 0 243 503 A1 | 11/1987 | ........... G11B/20/10 |
| EP | 0 424 191 A2 | 4/1991 | ........... G06F/11/00 |
| EP | 0 489 204 A1 | 6/1992 | ........... G11C/16/06 |

(List continued on next page.)

OTHER PUBLICATIONS

Book—Computer Architecture and Parallel Processing, Kai Hwang & Faye A. Briggs, McGraw–Hill Book Co., © 1984, p. 64.
Magazine—"State of the Art: Magnetic Vs. Optical Store Data in a Flash", by Walter Lahti and Dean McCarron, Byte magazine dated Nov. 1, 1990, 311, vol. 15, No. 12.

(List continued on next page.)

Primary Examiner—Tuan V. Thai
(74) Attorney, Agent, or Firm—Law Offices of Imam

(57) ABSTRACT

A method and circuit for fast memory access (read or write) of the data to and from a memory array is disclosed. Architecture wise, the memory array control circuit provides for at least two address latches and two page registers. The first address latch contains a first data address and the second address latch contains a second data address. The first data address is decoded first and sent to the memory array to access (read or write) the corresponding data from the memory array. When the data of the first data address is being accessed, the decoding process will begin for a second data address. When the data of the first data address has been accessed, the second data address is ready for the memory array. Thus, there can be continuous fetching from or writing to the memory array. In the preferred embodiment, there are two page registers. In a read operation, the data read from the first data address is transferred to a first page register. When the data of the second data address is being accessed, the data in the first page register is transferred to a second page register. When the operation to read the data from the second data address is completed, the data can be placed in the first register. The data in the second page register can be rapidly transferred to a latch and on to a bus. In this manner, there is always space made available for the data read. Similarly, in a write operation, data is transferred from the data bus to the second page register and then to the first page register. The data in the first register is written into the memory array.

12 Claims, 4 Drawing Sheets

U.S. PATENT DOCUMENTS

| | | |
|---|---|---|
| 4,279,024 A | 7/1981 | Schrenk .................... 365/203 |
| 4,281,398 A | 7/1981 | McKenny et al. ......... 365/200 |
| 4,295,205 A | 10/1981 | Kunstadt ................... 364/900 |
| 4,309,627 A | 1/1982 | Tabata ...................... 307/362 |
| 4,354,253 A | 10/1982 | Naden ........................ 365/15 |
| 4,355,376 A | 10/1982 | Gould ....................... 365/200 |
| 4,380,066 A | 4/1983 | Spencer et al. .............. 371/10 |
| 4,392,208 A | 7/1983 | Burrows et al. ........... 364/900 |
| 4,405,952 A | 9/1983 | Slakmon ..................... 360/49 |
| 4,422,161 A | 12/1983 | Kressel et al. ............. 365/200 |
| 4,450,559 A | 5/1984 | Bond et al. .................. 371/10 |
| 4,456,971 A | 6/1984 | Fukuda et al. ............. 364/900 |
| 4,462,086 A | 7/1984 | Kurakake ................... 364/900 |
| 4,463,450 A | 7/1984 | Haeusele ................... 365/200 |
| 4,479,214 A | 10/1984 | Ryan ......................... 371/11 |
| 4,493,075 A | 1/1985 | Anderson et al. ............ 371/10 |
| 4,498,146 A | 2/1985 | Martinez .................... 364/900 |
| 4,514,830 A | 4/1985 | Hagiwara et al. ........... 365/200 |
| 4,525,839 A | 7/1985 | Nozawa et al. ............... 371/38 |
| 4,527,251 A | 7/1985 | Nibby, Jr. et al. .......... 364/900 |
| 4,586,163 A | 4/1986 | Koike ....................... 365/104 |
| 4,601,031 A | 7/1986 | Walker et al. ............... 371/10 |
| 4,612,640 A | 9/1986 | Mehrotra et al. ............ 371/51 |
| 4,616,311 A | 10/1986 | Sato .......................... 364/200 |
| 4,617,624 A | 10/1986 | Goodman ................... 364/200 |
| 4,617,651 A | 10/1986 | Ip et al. ..................... 365/200 |
| 4,642,759 A | 2/1987 | Foster ........................ 364/200 |
| 4,654,847 A | 3/1987 | Dutton ........................ 371/10 |
| 4,672,240 A | 6/1987 | Smith et al. ................ 307/449 |
| 4,688,219 A | 8/1987 | Takemae ....................... 371/10 |
| 4,710,871 A | 12/1987 | Belknap et al. ............. 364/200 |
| 4,718,041 A | 1/1988 | Baglee et al. ................ 365/185 |
| 4,727,475 A | 2/1988 | Kiremidjian ................ 395/325 |
| 4,733,394 A | 3/1988 | Giebel ......................... 371/21 |
| 4,740,882 A | 4/1988 | Miller ........................ 364/132 |
| 4,746,998 A | 5/1988 | Robinson et al. ............ 360/72.1 |
| 4,748,320 A | 5/1988 | Yorimoto et al. ........... 235/492 |
| 4,757,474 A | 7/1988 | Fukushi et al. ............. 365/189 |
| 4,774,700 A | 9/1988 | Satoh et al. .................. 369/54 |
| 4,785,425 A | 11/1988 | Lavelle ........................ 365/52 |
| 4,794,568 A | 12/1988 | Lim et al. ................... 365/200 |
| 4,796,233 A | 1/1989 | Awaya et al. ................ 365/200 |
| 4,800,520 A | 1/1989 | Iijima ......................... 364/900 |
| 4,814,903 A | 3/1989 | Kulakowski et al. ......... 360/48 |
| 4,849,927 A | 7/1989 | Vos ............................ 364/900 |
| 4,887,234 A | 12/1989 | Iijima ......................... 364/900 |
| 4,896,262 A | 1/1990 | Wayama et al. ............. 364/200 |
| 4,914,529 A | 4/1990 | Bonke ........................ 360/48 |
| 4,920,518 A | 4/1990 | Nakamura et al. ........... 365/228 |
| 4,924,331 A | 5/1990 | Robinson et al. ............ 360/72.1 |
| 4,942,556 A | 7/1990 | Sasaki et al. ................ 365/200 |
| 4,943,962 A | 7/1990 | Imamiya et al. ......... 365/230.02 |
| 4,945,535 A | 7/1990 | Hosotani et al. ............. 371/11.1 |
| 4,949,240 A | 8/1990 | Iijima et al. ................. 364/200 |
| 4,949,309 A | 8/1990 | Rao ............................ 365/218 |
| 4,953,122 A | 8/1990 | Williams .................... 364/900 |
| 4,958,323 A | 9/1990 | Sugawara et al. ...... 365/189.01 |
| 5,003,591 A | 3/1991 | Kauffman et al. ............ 380/10 |
| 5,034,926 A | 7/1991 | Taura et al. ................. 365/218 |
| 5,043,940 A | 8/1991 | Harari ........................ 365/168 |
| 5,053,990 A | 10/1991 | Kreifels et al. .............. 364/900 |
| 5,058,074 A | 10/1991 | Sakamoto ................... 365/228 |
| 5,070,474 A | 12/1991 | Tuma et al. ................. 395/500 |
| 5,095,344 A | 3/1992 | Harari ...................... 357/23.5 |
| 5,134,589 A | 7/1992 | Hamano ................... 365/238.5 |
| 5,138,580 A | 8/1992 | Farrugia .................... 365/218 |
| 5,155,705 A | 10/1992 | Goto et al. .................. 365/218 |
| 5,163,021 A | 11/1992 | Mehrotra et al. ........... 365/185 |
| 5,168,465 A | 12/1992 | Harari ........................ 257/320 |
| 5,172,338 A | 12/1992 | Mehrotra et al. ............ 365/185 |
| 5,198,380 A | 3/1993 | Harari ......................... 437/43 |
| 5,200,959 A | 4/1993 | Gross et al. ................ 371/21.6 |
| 5,226,168 A | 7/1993 | Kobayashi et al. ......... 395/800 |
| 5,268,318 A | 12/1993 | Harari ......................... 437/43 |
| 5,268,870 A | 12/1993 | Harari ........................ 365/218 |
| 5,268,928 A | 12/1993 | Herh et al. .................... 375/8 |
| 5,270,979 A | 12/1993 | Harari et al. ................ 365/218 |
| 5,280,198 A | 1/1994 | Almulla ................... 307/296.6 |
| 5,283,762 A | 2/1994 | Fujishima .............. 365/189.09 |
| 5,283,882 A | 2/1994 | Smith et al. ................ 395/425 |
| 5,293,560 A | 3/1994 | Harari ........................ 365/185 |
| 5,297,148 A | 3/1994 | Harari et al. .............. 371/10.2 |
| 5,303,198 A | 4/1994 | Adachi et al. .............. 365/218 |
| 5,315,541 A | 5/1994 | Harari et al. ................. 365/63 |
| 5,329,491 A | 7/1994 | Brown et al. ............... 365/226 |
| 5,337,275 A | 8/1994 | Garner ................... 365/189.01 |
| 5,341,330 A | 8/1994 | Wells et al. ................. 365/185 |
| 5,341,339 A | 8/1994 | Wells ........................ 365/218 |
| 5,343,086 A | 8/1994 | Fung et al. ............... 307/296.1 |
| 5,353,256 A | 10/1994 | Fandrich et al. ........ 365/230.03 |
| 5,357,475 A | 10/1994 | Hasbun et al. .............. 365/218 |
| 5,363,335 A | 11/1994 | Jungroth et al. ............ 365/226 |
| 5,369,615 A | 11/1994 | Harari et al. ............... 365/218 |
| 5,388,083 A | 2/1995 | Assar et al. ................ 365/218 |
| 5,396,468 A | 3/1995 | Harari et al. ................ 365/218 |
| 5,418,752 A | 5/1995 | Harari et al. ................ 365/218 |
| 5,422,842 A | 6/1995 | Cernea et al. .............. 365/185 |
| 5,428,569 A | 6/1995 | Kato et al. ................... 365/185 |
| 5,428,621 A | 6/1995 | Mehrotra et al. ........... 371/21.4 |
| 5,430,682 A | 7/1995 | Ishikawa et al. ............ 365/226 |
| 5,430,859 A | 7/1995 | Norman et al. ............. 395/425 |
| 5,434,825 A | 7/1995 | Harari ........................ 365/185 |
| 5,438,573 A | 8/1995 | Mangan et al. ............ 371/10.3 |
| 5,446,408 A | 8/1995 | Tedrow et al. .............. 327/530 |
| 5,471,478 A | 11/1995 | Mangan et al. ............ 371/10.3 |
| 5,479,633 A | 12/1995 | Wells et al. ................. 395/430 |
| 5,479,638 A | 12/1995 | Assar et al. ................ 395/430 |
| 5,485,595 A | 1/1996 | Assar et al. ................ 395/430 |
| 5,495,442 A | 2/1996 | Cernea et al. ........... 365/185.03 |
| 5,495,453 A | 2/1996 | Wociechowski et al. ..................... 365/185.18 |
| 5,502,682 A | 3/1996 | Yoshimura et al. ......... 365/226 |
| 5,504,760 A | 4/1996 | Harari et al. .............. 371/40.1 |
| 5,508,971 A | 4/1996 | Cernea et al. .......... 365/185.23 |
| 5,524,230 A | 6/1996 | Sakaue et al. .............. 395/430 |
| 5,526,508 A * | 6/1996 | Park et al. ................... 711/122 |
| 5,532,962 A | 7/1996 | Auclair et al. .............. 365/201 |
| 5,532,964 A | 7/1996 | Cernea et al. .......... 365/189.09 |
| 5,534,456 A | 7/1996 | Yuan et al. ................... 437/43 |
| 5,535,328 A | 7/1996 | Harari et al. ............ 395/182.05 |
| 5,544,118 A | 8/1996 | Harari ........................ 365/218 |
| 5,544,356 A | 8/1996 | Robinson et al. ........... 395/600 |
| 5,554,553 A | 9/1996 | Harari ......................... 437/43 |
| 5,563,825 A | 10/1996 | Cernea et al. .......... 365/185.18 |
| 5,566,314 A | 10/1996 | DeMarco et al. ........... 395/430 |
| 5,568,439 A | 10/1996 | Harari ........................ 365/218 |
| 5,581,723 A | 12/1996 | Hasbun et al. .............. 395/430 |
| 5,583,812 A | 12/1996 | Harari ..................... 365/185.33 |
| 5,586,285 A | 12/1996 | Hasbun et al. .............. 395/430 |
| 5,592,415 A | 1/1997 | Kato et al. .............. 365/185.01 |
| 5,592,420 A | 1/1997 | Cernea et al. .......... 365/185.18 |
| 5,603,001 A | 2/1997 | Sukegawa et al. .......... 395/430 |
| 5,603,052 A * | 2/1997 | Chejlava, Jr. et al. .......... 710/4 |
| 5,630,171 A * | 5/1997 | Chejlava, Jr. et al. ........ 710/23 |
| 5,642,312 A | 6/1997 | Harari .................... 365/185.33 |
| 5,663,901 A | 9/1997 | Wallace et al. ............... 365/52 |
| 5,693,570 A | 12/1997 | Cernea et al. ............... 437/205 |
| 5,712,819 A | 1/1998 | Harari .................... 365/185.29 |
| 5,719,808 A | 2/1998 | Harari et al. ........... 365/185.33 |
| 5,745,732 A * | 4/1998 | Cherukuri et al. ........... 711/168 |
| 5,778,418 A | 7/1998 | Auclair et al. .............. 711/101 |

| | | | | |
|---|---|---|---|---|
| 5,809,558 A | 9/1998 | Matthews et al. .......... 711/173 | | |
| 5,822,245 A | 10/1998 | Gupta et al. ........... 365/185.12 | | |
| 5,822,765 A * | 10/1998 | Boatright et al. ........... 711/146 | | |
| 5,826,107 A * | 10/1998 | Cline et al. .................... 710/27 | | |
| 5,831,929 A | 11/1998 | Manning ................... 365/233 | | |
| 5,835,935 A | 11/1998 | Estakhri et al. ............. 711/103 | | |
| 5,845,313 A | 12/1998 | Estakhri et al. ............. 711/103 | | |

FOREIGN PATENT DOCUMENTS

| | | | | |
|---|---|---|---|---|
| EP | 0 522 780 A2 | 1/1993 | ............. G06F/3/06 |
| EP | 0 544 252 A2 | 6/1993 | ........... G11C/16/06 |
| EP | 0 686 976 A2 | 12/1995 | ........... G11C/16/06 |
| FR | 93 01908 | 8/1993 | ........... G06F/12/02 |
| JP | 59-45695 A | 9/1982 | ........... G11C/17/00 |
| JP | 58-215794 A | 12/1983 | ........... G11C/17/00 |
| JP | 58-215795 A | 12/1983 | ........... G11C/17/00 |
| JP | 59-162695 A | 9/1984 | ........... G11C/17/00 |
| JP | 60-212900 | of 1985 | ........... G11C/29/00 |
| JP | 60076097 | 4/1985 | ........... G11C/17/00 |
| JP | 60-178564 | 9/1985 | ........... G06F/13/16 |
| JP | 61-96598 A | 5/1986 | ........... G11C/17/00 |
| JP | 62-283496 A | 12/1987 | ........... G11C/17/00 |
| JP | 62-283497 A | 12/1987 | ........... G11C/17/00 |
| JP | 63-183700 A | 7/1988 | ........... G11C/17/00 |
| JP | 1054543 | 3/1989 | ........... G06F/11/00 |
| JP | 4-332999 A | 11/1992 | ........... G11C/29/00 |
| JP | 6-250798 | 9/1994 | ............. G06F/3/08 |
| WO | 84/00628 | 2/1984 | ........... G06F/11/20 |

OTHER PUBLICATIONS

Magazine—Technology Updates, Integrated Circuits, "1–Mbit flash memories seek their role in system design", Ron Wilson, Senior Editor, Computer Design magazine 28 (1989) Mar. 1, No. 5, Tulsa OK, US, pp. 30 and 32.

1992 Symposium of VLSI Circuits Digest of Technical Papers, "EEPROM for Solid State Disk Applications", S. Mehoura et al., SunDisk Corporation, Santa Clara, R. W. Gregor et al., AT&T Bell Laboratories, Allentown, PA. pp. 24 and 25.

* cited by examiner

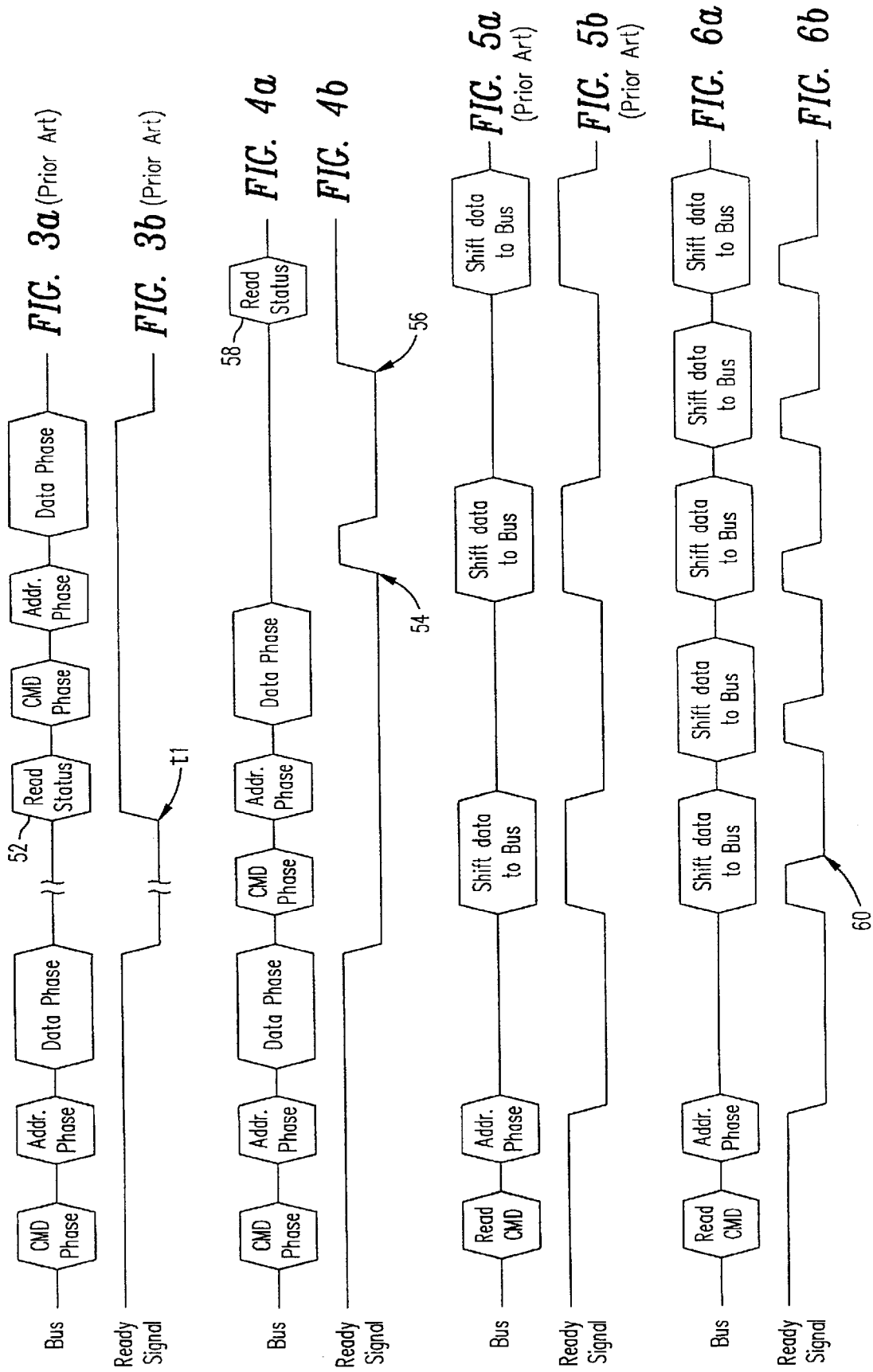

DATA PIPELINING METHOD AND APPARATUS FOR MEMORY CONTROL CIRCUIT

REFERENCED TO PRIOR APPLICATION

This application claims the benefit of previously filed U.S. Provisional Application No. 60/108,872 filed Nov. 17, 1998, and entitled "METHOD AND APPARATUS FOR MEMORY CONTROL CIRCUIT."

FIELD OF THE INVENTION

The present invention generally relates to nonvolatile memory arrays, and, in particular, to control circuits for increasing the speed of operations performed on the nonvolatile memory arrays.

BACKGROUND OF THE INVENTION

In the conventional method of accessing memory arrays (including flash memory arrays), whether it be a read or write operation, each operation is performed sequentially, meaning that an operation has to be completed before the start of the next read or write operation In performing an operation to access a memory array, the given data address is first decoded and the decoded address is provided to the memory array for fetching the data or storing the data. Because each of the decoding and accessing steps are done in a sequential maimer, these architectures of the prior art memory arrays do not lend themselves to faster throughputs necessary for modem-day high-speed memory access and throughput requirements.

Timing diagrams exemplifying prior art techniques are shown in FIGS. 3(a) and 3(b) and will be discussed in more detail later. Briefly, these prior art methods and systems require overhead time for shifting the data into a temporary storage location prior to storing the same in nonvolatile or flash memory for and during each write command. In fact, the next write command cannot begin prior to the completion of the tasks associated with performing a write command. Thus, system efficiency suffers where many write operations need be performed, as is the case in most memory systems.

Therefore, it would be desirable to have method and memory architecture conducive to high-speed memory throughput not limited to the sequential speed of each memory access.

SUMMARY OF THE INVENTION

It is the object of the present invention to provide a method and architecture for high speed accessing of a memory array with respect to write-to-memory and read-from-memory operations.

It is another object of the present invention to provide a method and architecture for high speed accessing of a memory array that allows for continuous read or write operations from and to the memory array.

It is yet another object of the present invention to provide a method and architecture for high speed accessing of a memory array, which allows for continuously decoding of data addresses for reading or writing from and to the memory array.

It is still another object of the present invention to provide a method and architecture, which allows for the decoding of a data address while the data addressed by the previous data address is being accessed.

Briefly, the presently preferred embodiment of the present invention provides a method and architecture for fast memory access (read or write) of the data to and from a memory array. Architecture wise, the memory array control circuit provides for at least two address latches and two page registers. The first address latch contains a first data address and the second address latch contains a second data address. The first data address is decoded fi and sent to the memory array to access (read or write) the corresponding data from the memory array. When the data of the first data address is being accessed, the decoding process will begin for a second data address. When the data of the first data address has been accessed, the second data address is ready for the memory array. Thus, there can be continuous fetching from or writing to the memory array. In the preferred embodiment, there are two page registers. In a read operation, the data read from the first data address is transferred to a first page register. When the data of the second data address is being accessed, the data in the first page register is transferred to a second page register. When the operation to read the data from the second data address is completed, the data can be placed in the first register. The data in the second page register can be rapidly transferred to a latch and on to a bus. In this manner, there is always space made available for the data read. Similarly, in a write operation, data is transferred from the data bus to the second page register and then to the first page register. The data in the first register is written into the memory array.

An advantage of the present invention is that it provides a method and architecture for high speed accessing of a memory array with respect to write-to-memory and read-from-memory operations.

Another advantage of the present invention is that it provides a method and architecture for high speed accessing of a memory array that allows for continuous read or write operations from and to the memory array.

Yet another advantage of the present invention is that it provides a method and architecture for high speed accessing of a memory array, which allows continuously decoding of data addresses for reading or writing from and to the memory array.

Still yet another advantage of the present invention is that it provides a method and architecture, which allows for the decoding of a data address while the data addressed by the previous data address is being accessed.

These and other features and advantages of the present invention will become well understood upon examining the figures and reading the following detailed description of the invention.

IN THE DRAWINGS

FIGS. 3a and 3b illustrate prior art timing diagrams for a write operation.

FIGS. 4a and 4b illustrate timing diagrams for a write operation using the preferred embodiment of the present invention.

FIGS. 5a and 5b illustrate prior art timing diagrams for a read operation.

FIGS. 6a and 6b illustrate timing diagrams for a read operation using the preferred embodiment of the present invention.

DETAILED DESCRIPTION OF THE PREFERRED EMBODIMENTS

Figure 1:
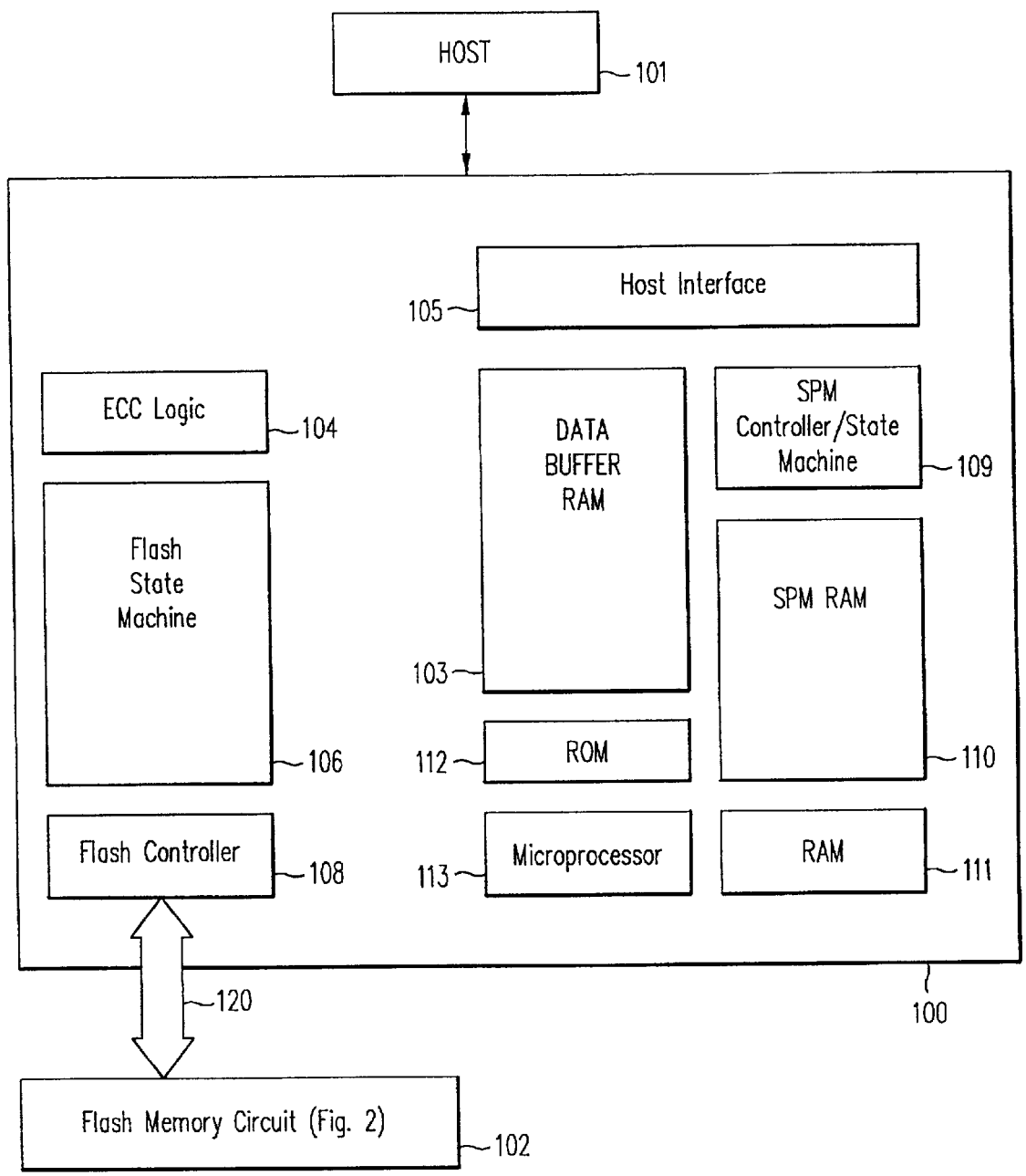
FIG. 1 is a block diagram illustrating the host, the memory controller and a memory circuit.

The description provided herein makes references to a flash (or nonvolatile, which may be other than flash, such as EEPROM memory array. However, it shall be understood that the present invention may be used in any memory architecture. Referring now to FIG. 1, a host 101 interfaces with a flash memory controller 100 in storing and retrieving digital information, in the form of user data or other kind of data, to and from a flash memory circuit 102. The controller 100 is generally comprised of a circuit for coding and decoding error correction code (ECC) 104, a flash state machine 106, a flash controller 108, a host interface 105 for communicating with the host, a SPM controller/state machine 109, SPM RAM 110, RAM 111, ROM 112, a microprocessor 113 and a data buffer RAM 103. The data buffer RAM 103 is used for temporary storage of information prior to a more permanent storage of or after reading information from the flash memory circuit 102.

Figure 2:
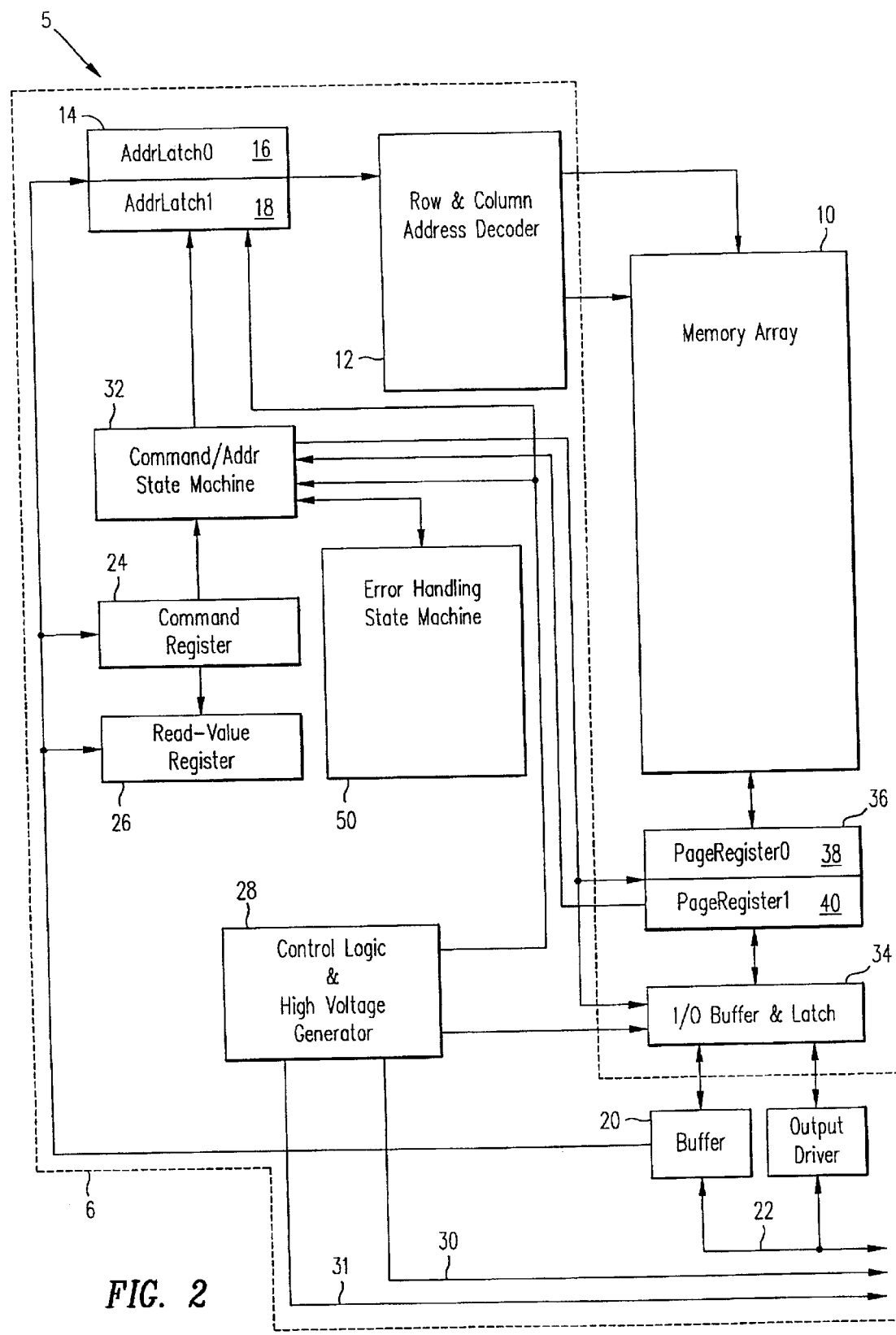
FIG. 2 is a detailed block diagram illustrating the memory circuit.

Referring now to FIG. 2, a flash memory circuit 5 is shown to include a flash memory cell array 10 and control circuitry 6 for operating the flash memory cell array 10 in accordance with an embodiment of the present invention. The control circuitry 6 includes a row and column address decoder 12, an address double latch 14, a buffer 20, a command register 24, a read-value register 26, a control logic unit 28, a state machine 32, an I/O buffer and latch 34, a double data latch 36 (which includes a PageRegister0 38 and a PageRegister1 40), an output driver 21 and an error handling state machine 50.

The flash memory cell array 10 includes flash memory cells that are addressable by row and column address signals provided by the row and column address decoder 12. The row and column address decoder 12 receives addresses from the address double latch 14. The double latch 14 is comprised of two latches, an AddrLatch0 16 and an AddrLatch1 18. The double address latch 14 receives its input from the buffer 20, which, in turn, receives its input from an I/O bus 22. The buffer 20 also provides signals to the command register 24 and the read-value register 26. The control logic unit 28 in response to input signals (ready signal and command/address control lines received at 30 and 31), and working in conjunction with the state machine 32 operates the buffer 20, 110 buffer and latch 34, and the double data latch 36. The double data latch 36 is comprised of PageRegister0 38 and PageRegister1 40 and sends (or writes) and/or receives (reads) data to and from the flash memory array 10. An error handling state machine 50 handles errors occurring in the writing to the memory array 10.

In operation, the controller (FIG. 1, 100) sends and receives 512 bytes of data (or as otherwise specified) plus error correction code (PCC) and address information to and from the flash memory circuit (FIG. 2, 102). When the controller sends (or writes) data to the flash memory circuit, the flash memory circuit latches the data to be written into a PageRegister (PageRegister0 38 or PageRegister1 40 in FIG. 2) and starts the write operation to the flash memory array 10. At this time the flash memory circuit (FIG. 1, 102) asserts a Ready/Busy signal, which is monitored by the controller (FIG. 1, 100) as to whether the flash memory circuit has completed the write operation. Once the controller (FIG. 1, 100) detects the end of the write operation, it reads the status register to check for any error conditions. If there was no error, the controller starts a new write operation by sending a new write command followed by new data In the present invention, a new write command and data is sent to the flash memory circuit while the previous data is being written the flash memory array. This has a pipelining effect. By pipelining the data, no time is lost in waiting for the completion of the previous write operation. The error handling state machine 50 is provided to handle errors occurring from the write operation thus relieving the controller from handling the errors.

In a read operation, the row and column address decoder 12, in response to an address received from AddrLatch0 or AddrLatch1, decodes the address, and provides the decoded address to the flash memory cell array 10. Data is then read from a location within the flash memory cell array 10 that is identified by the decoded address. The data that is read is then provided to the PageRegister0 38. In a write operation, an address from AddrLatch0 or AddrLatch1 is provided to the row and column address decoder 12 to activate the corresponding address(es) in the flash memory cell array 10. The data to be written to the flash memory cell 10 is provided by the PageRegister0 38 or PageRegister1 40.

One of the advantages of the present invention is that during a first time period the address can be read from AddrLatch0 16 to initiate the operation to write the data from PageRegister0 38. At the same time, a new address can be written to AddrLatch1 18 and a new data word can be written to PageRegister1 40. During a second time period, the address can be read in from AddrLatch1 and data can be read from PageRegister1 40. Moreover, a new address can be written to AddrLatch0 16 and the new data word can be written to PageRegister0 38. In this manner, a ping-pong effect is achieved where while a first set of address and data pair is being written to the flash memory array 10 a second set of address and data pair is being written to the corresponding address latch and page register for the next write operation. In an alternate embodiment, a first-in-first-out (FIFO) method can be implemented rather Man a ping-pong method.

More specifically, in operation, when the flash memory apparatus receives a write command, the address is shifted into AddrLatch0 16 and the corresponding data to be written is shifted into PageRegister0 38, and the data is then written to the corresponding flash memory cell array 10. During this period, the controller (FIG. 1, 100) determines if there is another write command pending from the host. If there is another write command pending, the address for the new data is shifted into AddrLatch1 18 and the corresponding new data is shifted into PageRegister1 40. At the end of the first write command, the command/address state machine 32 checks error status to verify successful completion of the write command. If the write command was completed successfully, the command pending flag is checked. If there is a command pending and a new word of data is received at the alternate PageRegister1 40, data in PageRegister1 40 is written to the flash memory cell array 10. In this manner, a ping-pong effect is achieved where while data in one PageRegister is being written to the flash memory cell array, another word of data is being loaded into the alternate PageRegister in preparation for writing during the next time period. This process continues until no new data is to be written to the flash memory array or an error condition occurred. This process eliminates the overhead time required for shifting the data into the PageRegister for each write command.

FIGS. 3a and 3b illustrate a prior art firing diagram and FIGS. 4a and 4b illustrate the timing diagram showing the elimination of the overhead time required for loading data into the PageRegister. FIG. 3a illustrates the state of the I/O bus where there is a command phase followed by a address phase followed by a data phase and a break for writing the data into the flash memory array. At the end of the first write cycle, the error status is checked (read status phase indicated at 52) to ensure successful completion of the write cycle. FIG. 3b illustrates the state of the ready signal where the bus is available during time t1 but is not being used. FIG. 4a illustrates the state of the I/O bus where there is not a break after a command/address/data phase. Instead, it is immediately followed by another command/address/data phase to load AddrLatch0 or AddrLatch1 and PageRegister0 or PageRegister1. The state of the ready signal is illustrated in FIG. 4b. In this setup, the end of the first write operation occurs in time as indicated at 54 and the end of the second write operation occurs in time as indicated at 56. There is a phase (58) for reading the status for the completion of the write operation. In this manner, a faster throughput is achieved by using the previous write-to-array-time for loading of another address/data into the respective registers (ping-pong).

During a read operation, the flash memory circuit receives a read command causing the requested data to be read from the flash memory array to PageRegister0 and transferred to PageRegister1 (similar to a FIFO). The data now on PageRegister1 is sent to the controller (requester). As the data is being transferred from PageRegister1 to the controller via the I/O bus, the Command/Address state machine starts a new read operation where the data read is shifted to PageRegister0. When the controller finishes receiving the data from PageRegister1, the content of PageRegister0 is transferred to PageRegister1 and sent to the controller.

The command/add state machine checks if the number of read has been achieved by looking at the value in the read-value register. The value in this register is loaded by the controller before the start of the read command to indicate the number of read operation requested.

FIG. 5a illustrates the prior art approach showing the state of I/O bus where there is a read command phase followed by an address phase and a waiting period for the data to be read from the flash memory array before it is shifted on to the bus. This cycle is followed by another waiting period before data can be shifted on to the bus. FIG. 5b illustrates the state of the ready signal. FIG. 6a illustrates the state of the I/O bus under the preferred embodiment where a read command phase is followed by an address phase and a waiting period for reading of the first data. After the first word of data is read, it can be shifted on to the bus. When the data is being transferred to the controller, the next data word is read from the flash memory array. In this manner, data can be rapidly transferred from the memory on to the bus. FIG. 6b illustrates the state of the ready signal where the timing for starting the reading operation for the next word of data is indicated at 60.

In an alternate embodiment, a first latch can be put in place selectively connect PageRegister0 or PageRegister1 to the flash memory array and a second latch can be put into place to selectively connect PageRegister0 and PageRegister1 to the I/O bus. In this manner, maximum flexibility can be afforded in operating this circuit.

Figure 7:
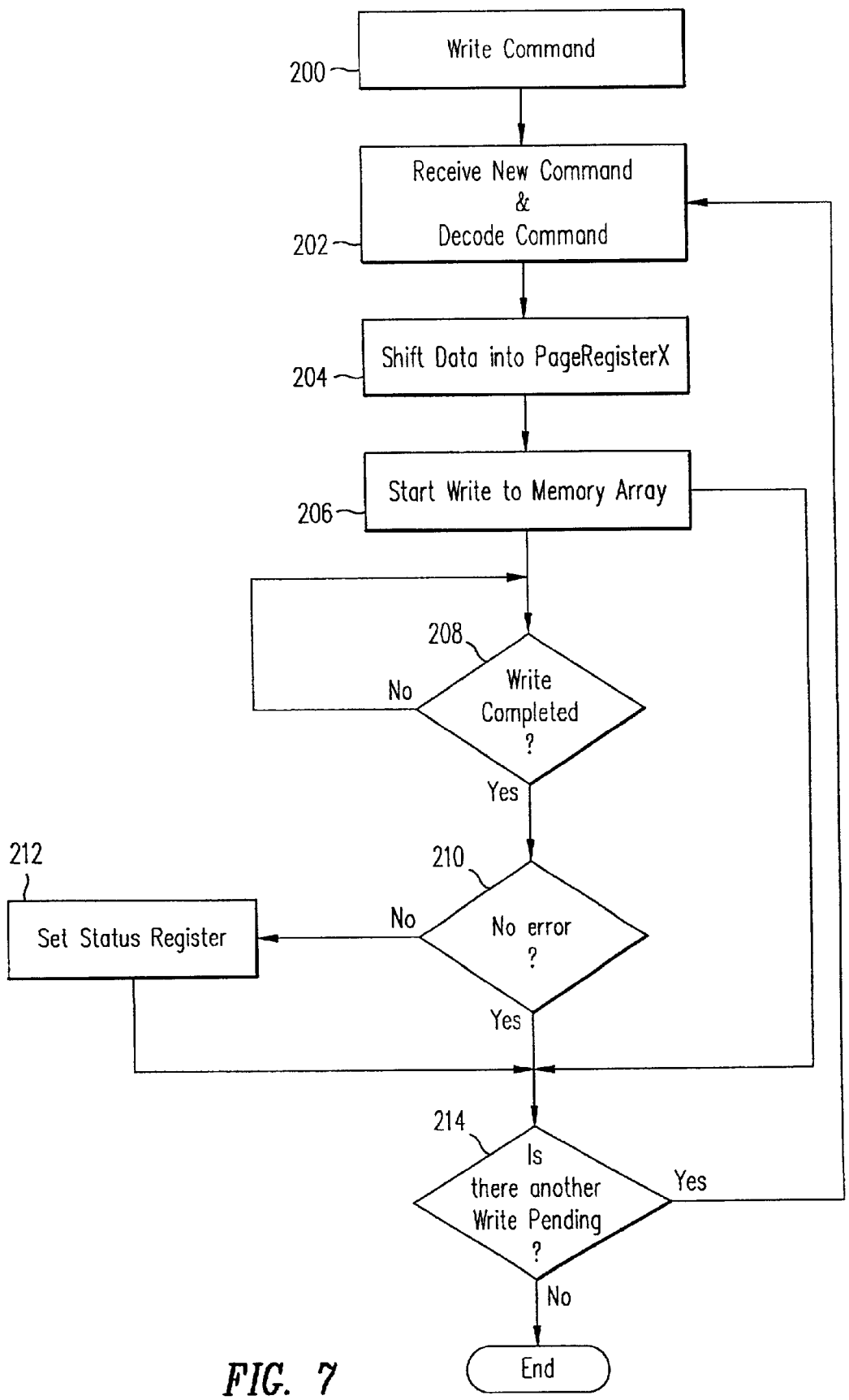
FIG. 7 is a flow chart illustrating the steps in writing to the memory array.

FIG. 7 illustrates the operating steps in a write operation. Here, in the first step 200, a write command is received and the command is decoded 202. The received data is shifted into an available PageRegister 204 and the write to memory array operation is initiated 206. The write operation is constantly checked for completion 208. Once the operation is completed, the logic checks for errors in the write operation 210. If there is an error in the write operation, the appropriate status register is set 212. At the same time the memory array is being written, the logic checks for the existence of a subsequent write operation. If there is another pending write operation, it is processed in the same manner where the logic flows back to step 202.

Although the present invention has been described in terms of specific embodiments it is anticipated that alterations and modifications thereof will no doubt become apparent to those skilled in the art. It is therefore intended that the following claims be interpreted as covering all such alterations and modifications as fall within the true spirit and scope of the invention.

What I claim is:

1. A nonvolatile memory control circuit for controlling reading and writing operations to and from a nonvolatile memory array, comprising:

a set of page registers having at least a first page register and a second page register for buffering data that is to be written to or read from a nonvolatile memory array; said control circuit for receiving commands to operate said set of page registers for reading from and writing to said nonvolatile memory array;

a set of address latches coupled to the nonvolatile memory array, said set of address latches having at least a first address latch for receiving data addresses for addressing the nonvolatile memory array;

a state machine for operating said set of page registers and said address latches;

an address decoder for receiving and decoding data addresses to the nonvolatile memory array;

a state machine control logic for operating said machine in response to received commands; and wherein during a current write command, data corresponding to the current write command is stored in said second page register while data corresponding to a previous write command is stored in the nonvolatile memory array from the first page register thereby creating a pipe-lining affect so as to expedite the performance of write operations to the nonvolatile memory array.

2. A nonvolatile memory control circuit as recited in claim 1 wherein during a first time period, said control circuit operates said set of address latches to have a first data address from said first address latch decoded for a read operation.

3. A nonvolatile memory control circuit as recited in claim 2 wherein, in a second time period, data read from said first data address of said memory array is fetched and placed in said first page register.

4. A nonvolatile memory control circuit as recited in claim 3 wherein, in said second time period, data in said first page register is transferred to a bus.

5. A nonvolatile memory control circuit as recited in claim 3 wherein said control circuit, in a second time period, operates said set of address latches to have a second data address from said second address latch decoded for a read operation.

6. A nonvolatile memory control circuit as recited in claim 5 wherein, in a third time period, data read from said second data address of said nonvolatile memory array is fetched and placed in said second page register.

7. A nonvolatile memory control circuit as recited in claim 1 wherein said control circuit, in a first time period, operates said set of address latches to have a first data address from said first address latch decoded for a write operation.

8. A nonvolatile memory control circuit as recited in claim 7 wherein, in a second time period, data stored in said first page register is placed in the nonvolatile memory array.

9. A nonvolatile memory control circuit as recited in claim 7 wherein said control circuitry, in said first time period, causes said first page register to store data to be stored in said memory array.

10. A nonvolatile memory control circuit as recited in claim 9 wherein said control circuit, in a second time period, operates said set of address latches to have a second data address from said second address latch decoded for a write operation.

11. A nonvolatile memory control circuit as recited in claim 10 wherein said control circuit, in said second time period, causes said second page register to store data to be stored in the nonvolatile memory array.

12. A nonvolatile memory control circuit for controlling reading and writing operations to and from a nonvolatile memory array, comprising:

a set of page registers coupled to a nonvolatile memory array, said set of page registers having at least a first page register and a second page register for buffering data that is to be written to or read from the nonvolatile memory array; said control circuit for receiving commands to operate said set of page registers for reading from and writing to the nonvolatile memory array;

control circuitry coupled to said set of page registers and the nonvolatile memory array wherein during a current write command, data corresponding to said write command is stored in said second page register while data corresponding to a previous write command is being stored in the nonvolatile memory array from the first page register thereby creating a pipe-lining affect to expedite performing write operations on the nonvolatile memory array;

a set of address latches coupled to the nonvolatile memory array, said set of address latches having at least first address latch for receiving data addresses for addressing the nonvolatile memory array;

a state machine for operating said set of page registers and said address latches;

an address decoder for receiving and decoding data addresses to the nonvolatile memory array; and a state machine control logic for operating said state machine in response to received commands.

* * * * *